(12) United States Patent
Hadley (10) Patent No.: US 9,450,586 B2
(45) Date of Patent: Sep. 20, 2016

(54) SECURITY SHIELD ASSEMBLY (71) Applicant: Hewlett-Packard Development Company, L.P., Houston, TX (US)

(72) Inventor: Ted A. Hadley, Sunnyvale, CA (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 0 days.

(21) Appl. No.: 14/432,910

(22) PCT Filed: Oct. 2, 2012

(86) PCT No.: PCT/US2012/058422
§ 371 (c)(1),
(2) Date: Apr. 1, 2015

(87) PCT Pub. No.: WO2014/055064
PCT Pub. Date: Apr. 10, 2014

(65) Prior Publication Data
US 2015/0244374 A1 Aug. 27, 2015

(51) Int. Cl.
| | |
|---|---|
| H03K 19/177 | (2006.01) |
| H05K 1/02 | (2006.01) |
| H05K 3/32 | (2006.01) |
| H05K 3/46 | (2006.01) |
| H05K 1/14 | (2006.01) |

(52) U.S. Cl.
CPC .... H03K 19/17768 (2013.01); H03K 19/1778 (2013.01); H05K 1/0275 (2013.01); H05K 3/32 (2013.01); H05K 3/46 (2013.01); H05K 1/0278 (2013.01); H05K 1/14 (2013.01); H05K 2201/047 (2013.01); Y10T 29/4913 (2015.01)

(58) Field of Classification Search
CPC ... G06F 21/86; H05K 5/0208; H05K 1/0275
See application file for complete search history.

(56) References Cited

U.S. PATENT DOCUMENTS

| | | |
|---|---|---|
| 3,990,069 A | 11/1976 | Schuman |
| 4,575,610 A | 3/1986 | Gavin |
| 4,807,284 A | 2/1989 | Kleijne |
| 4,811,288 A | 3/1989 | Kleijne et al. |
| 5,099,485 A | 3/1992 | Bruckert et al. |
| 5,159,629 A | 10/1992 | Double et al. |
| 5,309,387 A | 5/1994 | Mori |
| 5,353,350 A | 10/1994 | Unsworth et al. |

(Continued)

FOREIGN PATENT DOCUMENTS

| | | |
|---|---|---|
| JP | 2005223299 A | 8/2005 |
| WO | WO-9622541 A1 | 7/1996 |

OTHER PUBLICATIONS

Hadley, Ted A., U.S. Appl. No. 13/052,755 entitled "Methods, Systems, and Apparatus to Prevent Memory Imprinting", filed Mar. 21, 2011, 55 pages.

(Continued)

*Primary Examiner* — Jany Richardson
(74) *Attorney, Agent, or Firm* — Trop, Pruner & Hu, P.C.

(57) ABSTRACT

A security shield assembly has a printed circuit board having a plurality of layers, the plurality of layers including an electrically conductive penetration sensor layer, dielectric layers, and at least one signal layer. An electronic unit is mounted to the printed circuit board and electrically connected to the signal layer.

19 Claims, 5 Drawing Sheets

(56) References Cited

U.S. PATENT DOCUMENTS

| | | | |
|---|---|---|---|
| 5,596,718 | A | 1/1997 | Boebert et al. |
| 5,656,931 | A | 8/1997 | Lau et al. |
| 5,790,670 | A | 8/1998 | Bramlett |
| 5,858,500 | A | 1/1999 | MacPherson |
| 6,396,400 | B1 | 5/2002 | Epstein, III et al. |
| 6,828,915 | B2 | 12/2004 | Gottlieb |
| 7,015,823 | B1 | 3/2006 | Gillen et al. |
| 7,247,791 | B2 | 7/2007 | Kulpa |
| 7,282,635 | B2 | 10/2007 | Utsunomiya et al. |
| 7,549,064 | B2 | 6/2009 | Elbert et al. |
| 7,743,262 | B2 | 6/2010 | Walmsley |
| 7,945,786 | B2 | 5/2011 | Kumar et al. |
| 8,245,026 | B1 | 8/2012 | Moore |
| 2002/0002683 | A1 | 1/2002 | Benson et al. |
| 2002/0084090 | A1 | 7/2002 | Farquhar et al. |
| 2006/0259788 | A1 | 11/2006 | Elbert et al. |
| 2007/0018334 | A1 | 1/2007 | Peytavy et al. |
| 2007/0038865 | A1* | 2/2007 | Oggioni ............... G06F 21/87 713/178 |
| 2007/0155302 | A1 | 7/2007 | Dangler et al. |
| 2008/0253085 | A1 | 10/2008 | Soffer |
| 2009/0086965 | A1 | 4/2009 | Glendinning |
| 2009/0099025 | A1 | 4/2009 | Uchaykin |
| 2010/0270923 | A1 | 10/2010 | Froehlich et al. |
| 2012/0047374 | A1 | 2/2012 | Klum et al. |
| 2012/0081859 | A1 | 4/2012 | Christo et al. |
| 2012/0141753 | A1 | 6/2012 | Hunrath |
| 2012/0184326 | A1 | 7/2012 | Asterland |
| 2012/0254637 | A1 | 10/2012 | Yasaki et al. |

OTHER PUBLICATIONS

Hadley, Ted A., U.S. Appl. No. 13/662,678 entitled "Managing a Fault Condition by a Security Module", filed Oct. 29, 2012, 24 pages.

International Search Report & Written Opinion received in PCT Application No. PCT/US2012/058422, Jul. 25, 2013, 11 pages.

Sanapala. R. et al., "Effect of Lead-free Soldering on Key Material Properties of FR-4 Printed Circuit Board Laminates," (Research Paper), International Conference on Electronic Materials and Packaging, Oct. 22-24, 2008, pp. 195-199.

* cited by examiner

SECURITY SHIELD ASSEMBLY

BACKGROUND

A security module can be used to provide security functions for protecting data. The security module can include a circuit board having electronic circuitry to perform the security functions. The security module can store secret information, such as a cryptographic key, that can be used for cryptographically protecting data (by encrypting data using the cryptographic key).

A security module may be subject to attack by an attacker to obtain secret information stored in the security module. The attack may involve physical penetration of or other physical tampering with the security module.

BRIEF DESCRIPTION OF THE DRAWINGS

Some embodiments are described with respect to the following figures.

DETAILED DESCRIPTION

A security module (sometimes referred to as a hardware security module) can be used to perform cryptographic computations or other security functions on data, such as data of a financial transaction, electronic signature verification, and so forth. The cryptographic computation or other security function on data is performed to protect the data from unauthorized access. To perform its security functions, the security module can store secret information, which can be a cryptographic key or other type of secret information (e.g. password, etc.).

In some implementations, a security module may include a circuit board, which is removably connectable to a system, such as a computer system, a tablet, a game appliance, a television set-top box, and so forth. Data from the system can be provided to the security module, which can encrypt the data using a cryptographic key, for example. The encrypted data can then be provided to the system, which can communicate the encrypted data with another entity, such as over a network.

To defeat data protection offered by the security module, an attacker may attempt to physically penetrate or otherwise tamper with the security module in an effort to access the secret information that is stored in the security module. Once the secret information is derived by the attacker, the attacker can then gain access to data that is being protected by the security module. For example, if the attacker is able to gain access to a cryptographic key, then the attacker can decrypt encrypted data using the cryptographic key.

The security module can be provided with mechanisms to detect physical tampering or penetration of the security module. Penetration can be accomplished by drilling a hole through a cover of the security module. A probe can then be inserted through the hole to probe electronic circuitry inside the security module, such as a memory device or a signal trace in the security module. Alternatively, an attacker may tamper with the security module to disassemble the cover that is provided around the security module.

To detect physical tampering or penetration of a security module, a cover of the security module can be provided with an electrically conductive penetration sensor layer. Any attempt to drill through the cover may result in breakage of the penetration sensor layer, which can be detected.

The cost of manufacturing certain types of covers for security modules may be relatively high. Also, some security module covers may have reliability issues, and may not offer flexibility in how components of a security module can be arranged.

In accordance with some implementations, a security shield assembly (which has one or multiple covers) for a security module can be implemented as a printed circuit board (PCB) having multiple layers, where the multiple layers include electrically conductive penetration sensor layers, dielectric layers, and at least one signal layer. Implementing the security shield assembly as a PCB allows the security shield assembly to be made using PCB manufacturing techniques, which are relatively well established. As a result, the cost of manufacturing security modules can be reduced, and the reliability of the security shield assembly can be enhanced.

Conducting layers in a PCB can be made of relatively thin electrically conductive materials, such as copper or other types of conductive materials. The electrically conductive layers can be patterned (printed) onto dielectric layers. The dielectric layers can be laminated together to form the PCB. In some implementations, a PCB that is part of a security shield assembly can have relatively rigid dielectric layers. For example, a dielectric layer can be formed of a glass-reinforced epoxy laminate layer, such as an FR-4 layer. In other examples, other relatively rigid dielectric layers can be used. When the various dielectric layers are laminated together, the PCB becomes a relatively rigid structure that may be slightly bendable but is not capable of flexing by greater than some predefined angle.

Also, implementing a security shield assembly as a PCB allows for greater flexibility in how components of a security module can be arranged. For example, in addition to arranging electronic units on a main circuit board to be protected by the security shield assembly, one or multiple electronic units can also be arranged on the PCB that forms part of the security shield assembly. In some implementations, an electronic unit that can be mounted on the security shield assembly can perform certain predefined tasks, such as detection of physical tampering or penetration of the security shield assembly. In further examples, the electronics unit can also perform a security action in response to detected physical tampering or penetration, where the security action can include erasing (zeroizing) secret information stored in the security module, or locking access of secret information in the security module.

Figure 1:
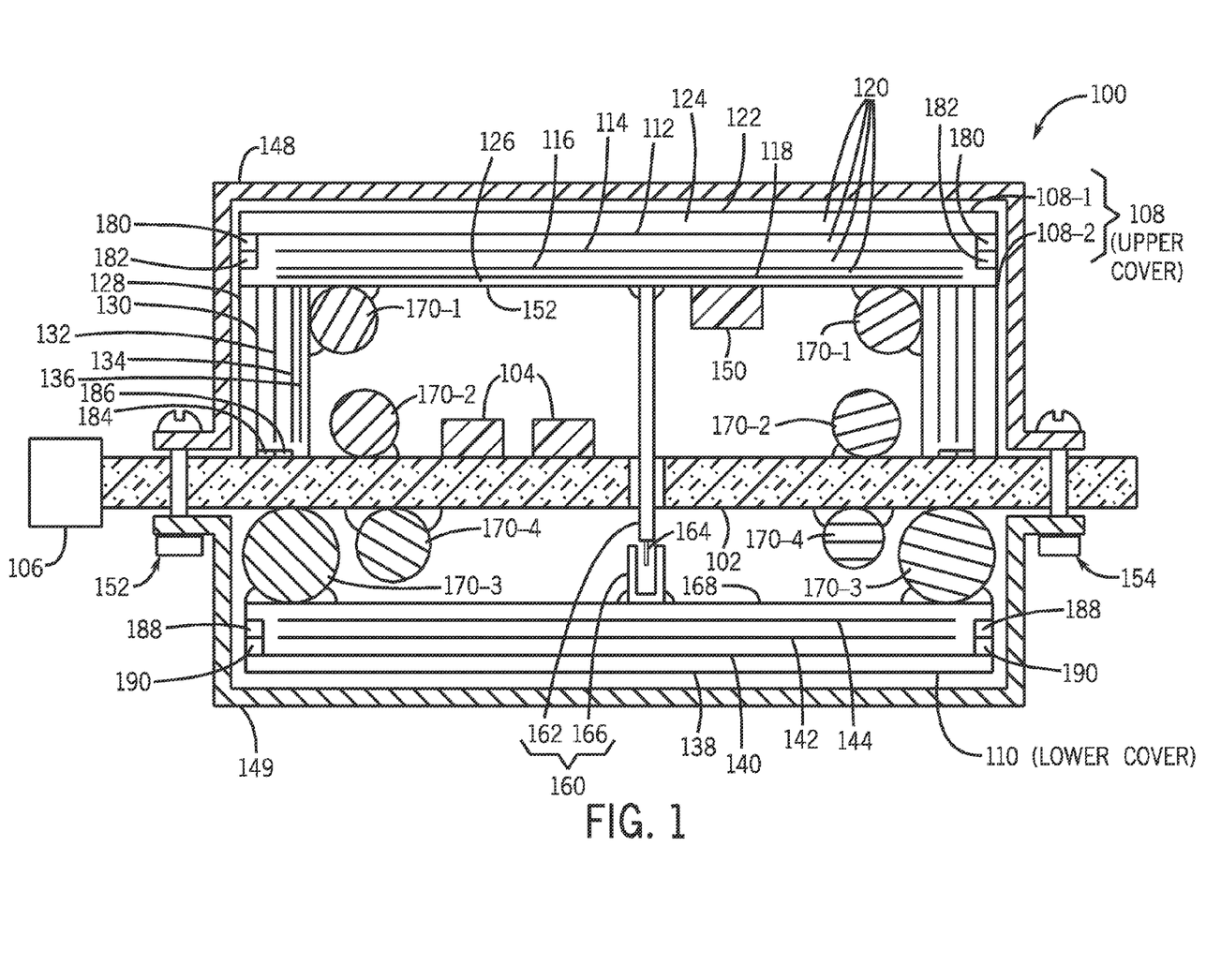
FIG. 1 is a schematic side sectional view of a security module according to some implementations.

FIG. 1 is a schematic side view of a security module 100 according to some implementations. The security module 100 has a main circuit board 102 (e.g. a PCB) on which various electronic components 104 are mounted. The electronic components 104 can include a microprocessor, an input/output (I/O) device, and so forth. One end of the main circuit board 102 is attached to a bracket 106, which can allow the security module 100 to be removably connected to a system, such as a computer system or another type of system.

The security module 100 has a security shield assembly to protect the main circuit board 102. The security shield assembly prevents physical access of electronic circuitry in the security module 100. In the example of FIG. 1, the security shield assembly includes an upper cover 108 and a lower cover 110. The upper cover 108 includes a top cover member 108-1 and a side cover member 108-2. As depicted, the side cover member 108-2 is generally perpendicular to the upper cover member 108-1. In other examples, the side cover member 108-2 can be provided at an angle with respect to the top cover member 108-1. Note that the side cover member 108-2 has multiple (e.g. four) sides to surround a region on the main circuit board 102.

The upper cover 108 has various layers, including an electrical ground layer 112, electrically conductive penetration sensor layers 114 and 116, and a signal layer 118. In other implementations, multiple signal layers may be present. Dielectric layers 120 are provided between successive ones of the layers 112, 114, 116, and 118. Additionally, the top cover member 108-1 has an outer layer 122, which can be an outer ground layer in some examples. A dielectric layer 124 is provided between the ground layer 112 and the outer layer 122. Another dielectric layer 126 is provided below the signal layer 118.

It is noted that the layers depicted in FIG. 1 are provided for purposes of example. In other examples, other combinations of layers can be provided in the upper cover 108 and the lower cover 110.

The side cover member 108-2 similarly includes an outer layer 128, a ground layer 130, electrically conductive penetration sensor layers 132 and 134, and a signal layer 136. Dielectric layers are similarly provided between successive ones of the layers.

The lower cover 110 also includes an outer layer 138, a ground layer 140, electrically conductive penetration sensor layers 142 and 144, and dielectric layers between successive ones of the various layers. Although a signal layer is not depicted in the lower cover 110, it is noted that a signal layer can be provided in the lower cover 110 in other examples.

Each of the upper cover member 108-1, side cover member 108-2, and lower cover 110 can be implemented as a respective printed circuit board (PCB), which has the various layers depicted in FIG. 1.

As additionally shown in FIG. 1, the security shield assembly further includes an upper shield cover 148 and a lower shield cover 149 to surround the upper and lower covers 108 and 110, respectively. The upper and lower shield covers 148 and 149, which can be formed of metal or some other material, can be attached together by attachment mechanisms 152 and 154. The attachment mechanisms 152 and 154 can include respective bolts that can extend through the main circuit board 102, in some implementations. In other examples, other types of attachment mechanisms can be employed to attach the upper and lower shield covers 148 and 149.

In accordance with some implementations, since the top cover member 108-1 is formed of a PCB, an electronic unit 150 can be mounted onto the inner surface 152 of the top cover member 108-1. Although not shown, vias can connect signal pins of the electronic unit 150 to signal traces in the signal layer 118. The electronic unit 150 can be a microcontroller or other type of integrated circuit (IC) chip. In some examples, the electronic unit 150 can be used for detecting penetration through the upper or lower cover 108 or 110. In further examples, the electronic unit 150 can additionally perform a security action in response to the detected tampering, where the security action can include erasing secret information stored by the security module 100, locking access to the security information (such that the secret information is inaccessible by a requestor), or other security action. The secret information can be stored in a storage (e.g. memory device) in the electronic unit 150, or alternatively, can be stored in one of the electronic units 104 on the main circuit board 102.

In some examples, the secret information can be a cryptographic key used to perform cryptographic computations (such as for encrypting data). In other examples, other types of secret information can be stored in the security module 100, such as passwords, and so forth.

One of the electronic units 104 on the main circuit board 102 can be a microprocessor, which is able to request a cryptographic key from the electronic unit 150. In response to such request, the electronic unit 150 can provide the cryptographic key to the microprocessor, which can then perform cryptographic computations on data (such as data received through the bracket 106 from an external system). The encrypted data can be provided by the microprocessor through the bracket 106 to the external system.

Although FIG. 1 shows the electronic unit 150 being mounted on the top cover member 108-1, it is noted that in alternative implementations, the electronic unit 150 can be mounted on the side cover member 108-2, or on the lower cover 110. Alternatively, separate electronic units can be provided on corresponding ones of the upper and lower covers 108 and 110.

In alternative implementations, instead of providing two discrete covers 108 and 110 as depicted in FIG. 1, the lower cover 110 can instead be replaced with a cover structure that is formed on the main circuit board 102. For example, such cover structure can include various layers of the main circuit board 102, where the various layers can include penetration sensor layers.

As further depicted in FIG. 1, one or multiple connector mechanisms 160 are provided to interconnect the upper cover 108 to the lower cover 110. The connector mechanism 160 has a connector rod 162. One end of the connector rod 162 can be attached to the inner surface 152 of the top cover member 108-1. The other end of the connector rod 162 has a connector portion 164 for engaging a connector receptacle 166 of the connector mechanism 160. The connector receptacle 166 is attached to an inner surface 168 of the lower cover 110.

An attacker may attempt to disassemble the upper cover 108 from the lower cover 110 to gain access to the electronic circuitry in the security module 100. Disassembling the upper cover 108 from the lower cover 110 causes disengagement of the connector portion 164 from the connector receptacle 166, which can provide a separation indication that can be detected by the electronic unit 150. In response, the electronic unit 150 can take a security action, such as erasing or locking access to the secret information stored in the security module 100.

As further depicted in FIG. 1, various drill barriers 170 (170-1, 170-2, 170-3, 170-4) can be provided inside the security shield assembly. Each of the drill barriers 170-1, 170-2, 170-3, and 170-4 can be formed of wires, which can have circular cross sections or cross sections of other shapes, that are run in a ring (circular ring, rectangular ring, or ring of another shape) around a respective region on the main circuit board 102 to be protected. The drill barriers 170 are designed to engage any drill bit or other element that penetrates through the upper and lower covers 108 and 110, or between those covers and the circuit board, as might happen during partial disassembly. The drill barriers 170 can be formed of an electrically conductive material. For example, the drill barriers 170 can be copper wires. The wires can have relatively large diameters, and the wires can be electrically connected to a reference voltage, such as electrical ground.

In examples according to FIG. 1, a drill barrier 170-1 (that runs in a ring) is provided in contact with the upper cover 108, and another drill barrier 170-2 (that runs in a ring) is provided in contact with the main circuit board 102. In addition, two concentrically arranged drill barriers 170-3 and 170-4 can be provided between the main circuit board 102 and the lower cover 110. The two concentrically arranged drill barriers 170-3 and 170-4 (an outer ring 170-3 and an inner ring 170-4) are arranged to provide protection against penetration even though the lower cover 110 does not have a side cover member like the upper cover 108. Drilling though the outer ring 170-3 may create burrs that create a short circuit between the outer and inner rings 170-3 and 170-4, which can be detected. Alternatively, the drill bit may cause a short circuit between the outer and inner rings.

In addition to the foregoing, the drill barriers 170 are provided to increase the depth that an attacker has to drill in a particular region where drilling is a vulnerability. Additionally, if the for drill barriers 170 are formed of a metallic material such as copper, a drill bit may not easily drill through the drill barriers. Also, copper tends to gall easily, which may cause a drill bit to bind and break. Larger drill bits that are less sensitive to galling are too large for drilling an attack hole through the upper and lower covers 108 and 110 without being detected by the penetration sensor layers 114, 116, 132, 134, 142, and 144.

A further protection mechanism that can be provided include ground rings 180, 182, 184, 186, 188, and 190 that can be provided around corresponding perimeters of penetration sensor layers 114, 116, 132, 134, 142, and 144. Thus, for example, the ground ring 180 is provided around the perimeter of the penetration sensor layer 114, the ground ring 182 is provided around the perimeter of the penetration sensor layer 116, and so forth.

A ground ring is electrically connected to ground and is provided around a perimeter of a penetration sensor layer to prevent probing of the respective penetration sensor layer. If a penetration sensor layer is successfully attacked, then the entire penetration detection system can be defeated and rendered useless.

Figures 2, 3:
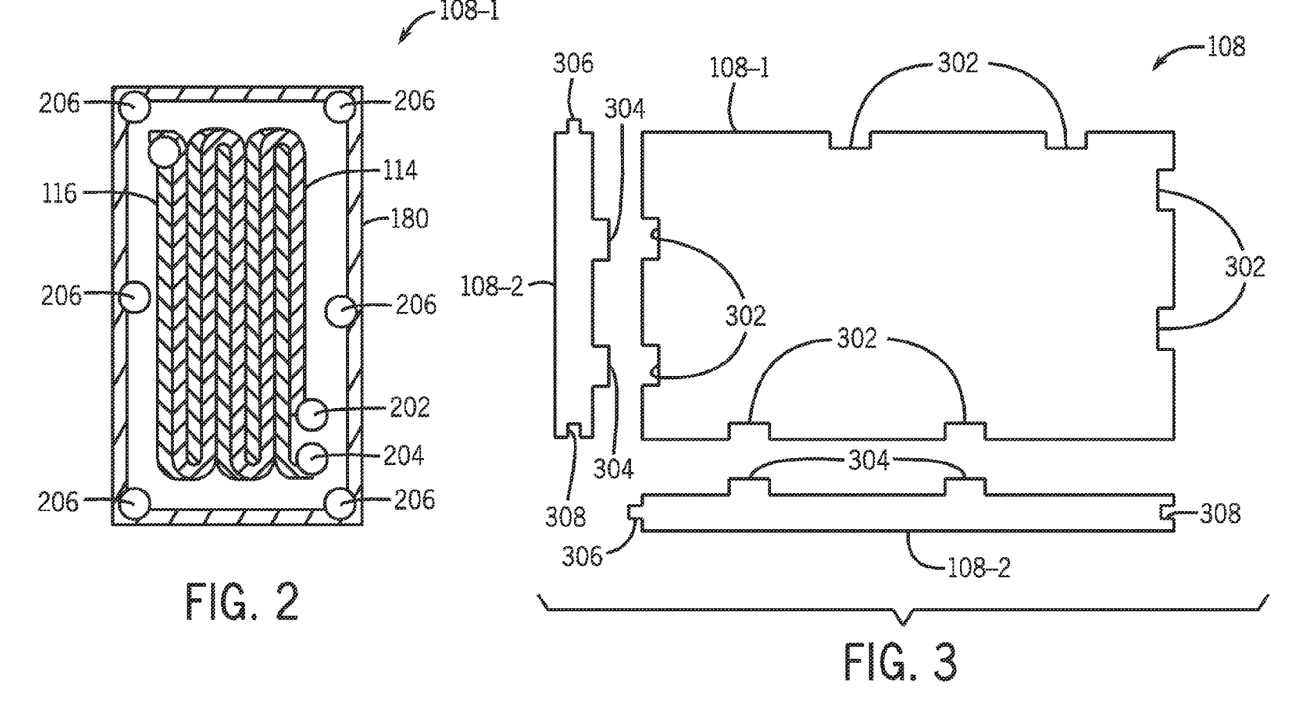
FIG. 2 is a schematic top sectional view of an upper cover of a security module according to some implementations.
FIG. 3 is an exploded view of several pieces of a security shield assembly of a security module according to some implementations.

FIG. 2 is a top sectional view of the top cover member 108-1, which shows the ground ring 180 provided around the perimeter of the penetration sensor layer 114. The penetration sensor layer 116, which is below the penetration sensor layer 114, is also visible in FIG. 2 (assuming that the dielectric layer between the penetration sensor layers 114 and 116 is transparent or translucent). As shown, each of the penetration sensor layers 114 and 116 can be provided in a serpentine pattern. The serpentine patterns of the respective penetration sensor layers 114 and 116 are coordinated to provide for full coverage around a specific area, such that an attacker is unable to drill through a cover without drilling through the electrically conductive material of one of the penetration sensor layers 114 and 116. Drilling through the electrically conductive material of one of the penetration sensor layers 114 and 116 results in an open circuit at the respective penetration sensor layer, which provides a penetration indication that can be detected by the electronic unit 150 of FIG. 1, for example.

In other examples, the penetration sensor layers 114 and 116 can have other patterns. In addition, more layers of penetration detection may be used than the two layers shown.

FIG. 2 also shows vias 202 and 204 to electrically connect the penetration sensor layers 114 and 116 to the signal layer 118 of FIG. 1. The electronic unit 150 can detect penetration through one of the penetration sensor layers 114 and 116. The vias 202 and 204 are buried or blind vias to prevent external probing.

Also, various vias 206 are provided at various positions along the ground ring 180, to connect the ground ring 180 to the ground layer 112 (FIG. 1).

FIG. 3 is an exploded schematic view of portions of the upper cover 108, including the top cover member 108-1 and two pieces of the side cover member 108-2. Note that the side cover member 108-2 may include four pieces to go around the periphery of the top cover member 108-1, but just two pieces are depicted in FIG. 3.

In examples according to FIG. 3, the top cover member 108-1 has alignment grooves 302 that are designed to engage with alignment tabs 304 on the pieces of the slide cover member 108-2. In addition, each piece of the side cover member 108-2 has an engagement tab 306 and an engagement groove 308. The engagement groove 308 of one piece of the side cover member 108-2 is configured to engage with the engagement tab 306 of another piece of the side cover member 108-2.

The various pieces of the upper cover 108 are designed to snap together using the various tabs and grooves, as depicted. This allows an assembler to easily connect the pieces of the upper cover 108 together, especially with the inside and outside surfaces properly oriented.

In other implementations, instead of using the tabs and notches as depicted in FIG. 3, other engagement profiles can be used.

Figure 4:
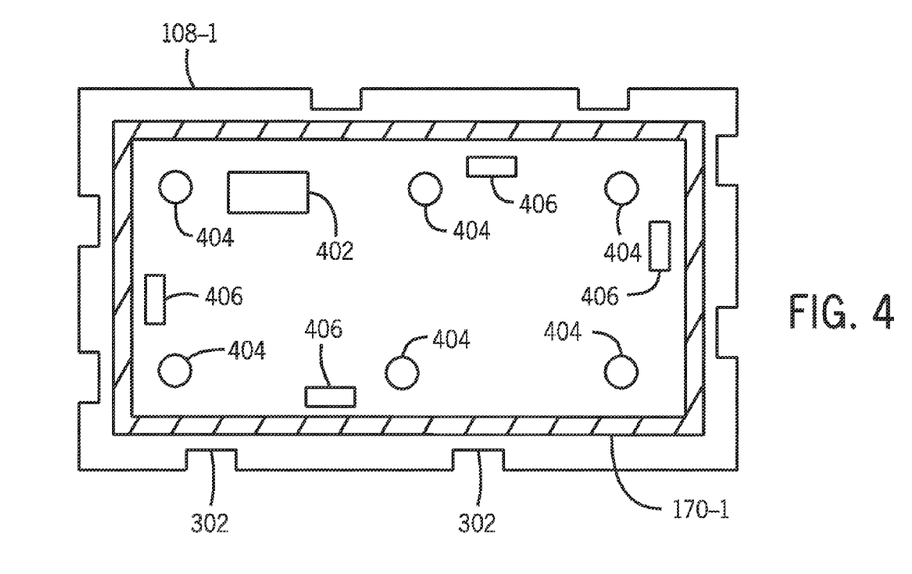
FIG. 4 is a bottom view of a top cover member of a security shield assembly, according to some implementations.

FIG. 4 is a bottom view of the top cover member 108-1, according to some implementations. The drill barrier 170-1 (arranged in a rectangular ring) is visible in the view of FIG. 4. In addition, various connection elements on the top cover member 108-1 are depicted in FIG. 4, where the connection elements allow for connection of respective layers of the top cover member 108-1 to other structures. For example, a connector 402 can be provided to interconnect the signal layer 118 of the top cover member 108-1 to the main circuit board 102. Additionally, contact vias 404 are provided to allow for interconnection of layers of the top cover member 108-1 to layers of the lower cover 110.

In addition, right-angle surface mount connectors 406 can be provided on the top cover member 108-1 to interconnect layers of the top cover member 108-1 to layers of the side cover member 108-2. The right-angle surface mount connector 406 has a portion that is perpendicular to another portion, to allow for connection between two members (108-1 and 108-2) that are generally perpendicular to each other. For example, as depicted in FIG. 5, a piece of the side cover member 108-2 has a surface mount connector 408 to connect to a corresponding surface mount connector 406 on the top cover member 108-1.

Figure 5:
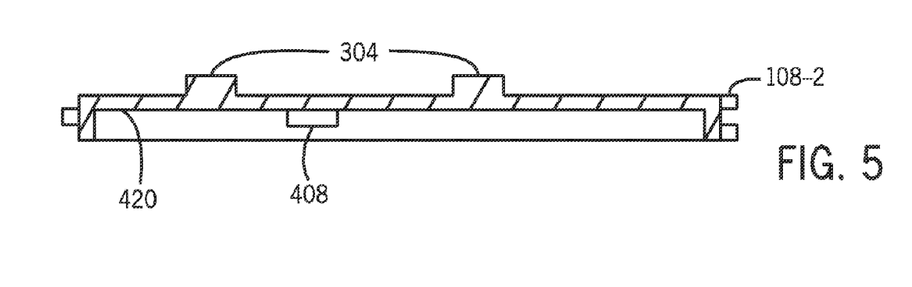
FIG. 5 is a side view of a piece of a side cover member of a security shield assembly, according to some implementations.

In addition, as depicted in FIG. 5, a portion 420 of the side cover member 108-2 is grounded. In this way, when the piece of the side cover member 108-2 is connected to other pieces of the side cover member 108-2, the various pieces can all be grounded. The grounded portion 420 also extends to the tabs 304 to allow for grounded connection to the top cover member 108-1. In addition, when the cover is assembled, the grounded portions 420 and 170-1 provide a surface for soldering the sections together.

Figure 6:
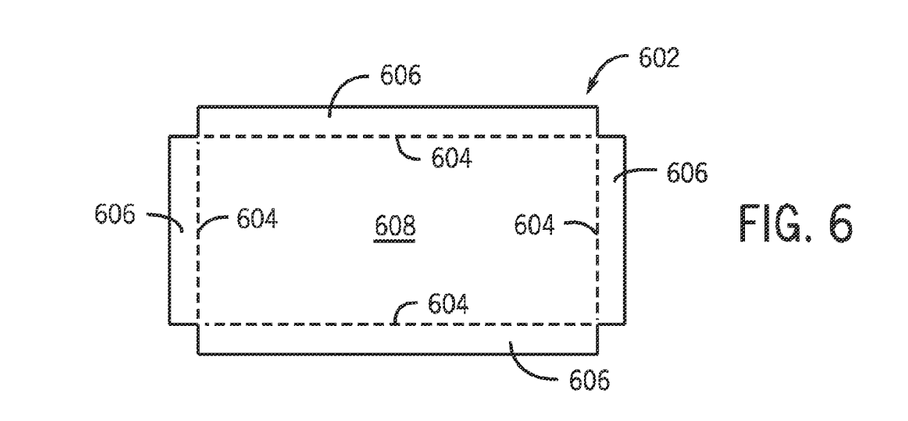
FIGS. 6-8 illustrate portions of a security shield assembly according to some implementations at various stages of a manufacturing process, in accordance with some implementations.

Although FIGS. 3-5 depict formation of the upper cover 108 using separate pieces, it is noted that in alternative implementations, as depicted in FIG. 6, the upper cover 108 (including the top cover member 108-1 and the side cover member 108-2) can be formed from an integral piece, such as a cover PCB 602 that starts out as a flat layer. The cover PCB 602 has a main portion 608 and side portions 606. Folding edges 604 are provided such that side portions 606 can be folded along the edges 604 with respect to the main portion 608.

Figure 7:
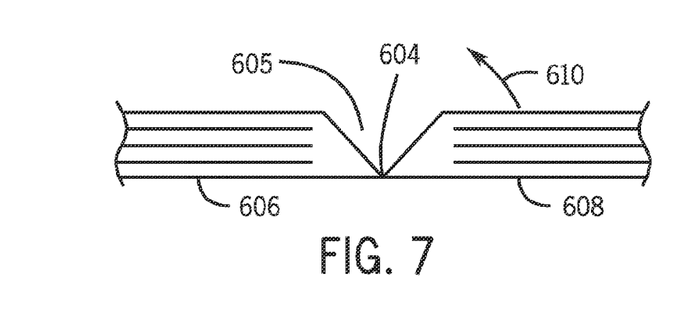
Figure 8:
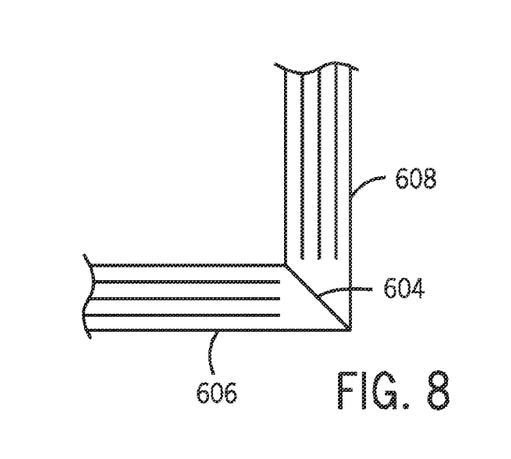

FIG. 7 is a side sectional view of a portion of the cover PCB 602 depicted in FIG. 6. The main portion 608 is connected to the side portion 606 at a folding edge 604. The folding edge 604 allows the main portion 608 to be pivoted towards the side portion 606 along direction 610. Alternatively, the side portion 606 can be pivoted towards the main portion 608 at the folding edge 604. Pivoting of the portions 606 and 608 about the folding edge 604 results in the structure in depicted in FIG. 8.

Note that various electrically conductive layers are not provided in the portion corresponding to a groove 605 located at the folding edge 604 of FIG. 7. This is to avoid any damage to such layers.

Figure 9:
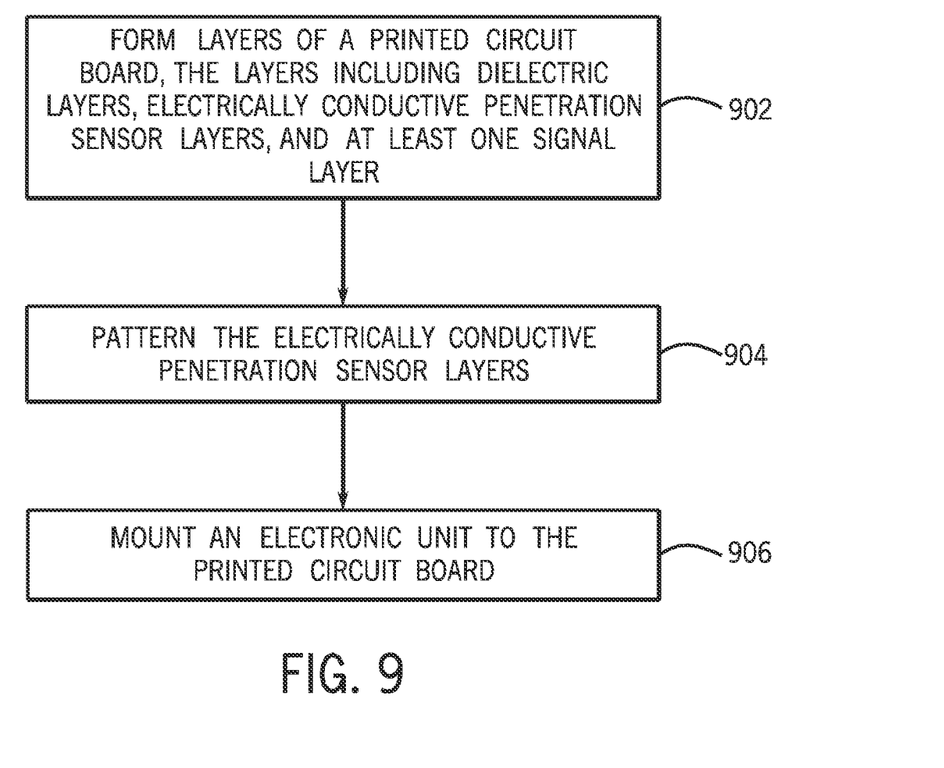
FIG. 9 is a flow diagram of a process of forming a security module according to some implementations.

FIG. 9 is a flow diagram of a process of making a security shield assembly according to some implementations. Multiple layers of a PCB making up the security shield assembly are formed (at 902), where the multiple layers include dielectric layers, electrically conductive penetration sensor layers between successive dielectric layers, and a signal layer. The electrically conductive penetration sensor layers are patterned (at 904) to have respective predetermined patterns that allow for detection of penetration tampering through the PCB. An electronic unit (e.g. 150 in FIG. 1) is mounted (at 906) to the PCB and is electrically connected to the signal layer. The electronic unit is able to receive an indication of tampering with respect to the security shield assembly.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A security shield assembly, comprising:
   a first printed circuit board having a plurality of layers, the plurality of layers including an electrically conductive penetration sensor layer, dielectric layers, and at least one signal layer, the electrically conductive penetration sensor layer having a predetermined patterns to detect penetration tampering through the first printed circuit board;
   an electronic unit mounted to the first printed circuit board and electrically connected to the signal layer;
   a second printed circuit board having a plurality of layers including an electrically conductive penetration sensor layer and dielectric layers, the electrically conductive penetration layer of the second printed circuit board having a predetermined pattern to detect penetration tampering through the second printed circuit board; and
   a connector mechanism to connect the first and second printed circuit boards, wherein disconnection of the connector mechanism resulting from separation of the first and second printed circuit boards provides a separation indication.

2. The security shield assembly of claim 1, further comprising a ground ring surrounding a perimeter of the electrically conductive penetration sensor layer of the first printed circuit board.

3. The security shield assembly of claim 1, wherein the first printed circuit board is for engagement with a main circuit board having circuitry that is to be protected by the security shield assembly, and wherein the plurality of layers further include a ground layer, the electrically conductive penetration sensor layer arranged between the ground layer and a module.

4. The security shield assembly of claim 1, wherein the electronic unit is to detect the separation indication and to perform a security action in response to the separation indication.

5. The security shield assembly of claim 1, wherein the electronic unit is to receive an indication of penetration tampering through the first printed circuit board detected by the electrically conductive penetration sensor layer of the first printed circuit board, and to perform a security action in response to the indication of penetration tampering through the first printed circuit board.

6. The security shield assembly of claim 1, wherein the first printed circuit board is for engagement with a main circuit board having electronic circuitry, and wherein the security shield assembly further comprises:
   multiple layers of the main circuit board, the multiple layers including an electrically conductive penetration sensor layer to detect penetration tampering.

7. The security shield assembly of claim 1, wherein the first printed circuit board is for engagement with a main circuit board having electronic circuitry that is to be protected by the security shield assembly, and the security shield assembly further comprises an electrically conductive barrier provided between the first printed circuit board and the main circuit board to provide a barrier to drilling penetration.

8. The security shield assembly of claim 7, wherein the electrically conductive barrier comprises a wire arranged in a ring.

9. A method of making a security shield assembly, comprising:
   forming a plurality of layers of a printed circuit board, wherein the plurality of layers comprise dielectric layers, electrically conductive penetration sensor layers between successive dielectric layers, and at least one signal layer;
   patterning the electrically conductive penetration sensor layers to have respective predetermined patterns that allow for detection of penetration tampering through the printed circuit board;
   mounting an electronic unit to the printed circuit board and electrically connecting the electronics layer to the signal layer, the electronic unit to receive an indication of penetration tampering detected by at least one of the electrically conductive penetration sensor layers; and
   connecting, with a connector mechanism, the printed circuit board to another structure, wherein the connector mechanism is to provide a separation indication in response to disconnection of the connector mechanism, and the electronic unit is to perform a security action in response to the separation indication.

10. The method of claim 9, wherein forming the dielectric layers comprise forming dielectric layers including a fiber glass material.

11. The method of claim 9, wherein the electronic unit is to further perform a security action in response to the indication of penetration tampering.

12. A security module comprising:
- a main circuit board having electronic components including storage to store secret information;
- a security shield assembly having:
  - a first printed circuit board to detect unauthorized physical access of the security module, the first printed circuit board having a plurality of layers, the plurality of layers including electrically conductive penetration sensor layers, dielectric layers, and at least one signal layer, the electrically conductive penetration sensor layers having respective predetermined patterns to detect penetration tampering through the first printed circuit board and
  - a second printed circuit board having a plurality of layers including an electrically conductive penetration sensor layer and dielectric layers, the electrically conductive penetration layer of the second printed circuit board having a predetermined pattern to detect penetration tampering through the second printed circuit board;
- an electronic unit mounted to the first printed circuit board and electrically connected to the signal layer; and
- a connector mechanism to connect the first and second printed circuit boards, wherein disconnection of the connector mechanism resulting from separation of the first and second printed circuit boards provides a separation indication.

13. The security module of claim 12, further comprising a ground ring surrounding a perimeter of the electrically conductive penetration sensor layers of the first printed circuit board.

14. The security module of claim 12, wherein the first printed circuit board is for engagement with a main circuit board having circuitry that is to be protected by the security shield assembly, and wherein the plurality of layers further include a ground layer, the electrically conductive penetration sensor layers arranged between the ground layer and the module.

15. The security module of claim 12, wherein the electronic unit is to detect the separation indication and to perform a security action in response to the separation indication.

16. The security module of claim 12, wherein the electronic unit is to receive an indication of penetration tampering through the first printed circuit board detected by the electrically conductive penetration sensor layers of the first printed circuit board, and to perform a security action in response to the indication of penetration tampering through the first printed circuit board.

17. The security module of claim 12, wherein the first printed circuit board is for engagement with a main circuit board having electronic circuitry, and wherein the security shield assembly further comprises:
- multiple layers of the main circuit board, the multiple layers including an electrically conductive penetration sensor layer to detect penetration tampering.

18. The security module of claim 12, wherein the first printed circuit board is for engagement with a main circuit board having electronic circuitry that is to be protected by the security shield assembly, and the security shield assembly further comprises an electrically conductive barrier provided between the first printed circuit board and the main circuit board to provide a barrier to drilling penetration.

19. The security module of claim 18, wherein the electrically conductive barrier comprises a wire arranged in a ring.

* * * * *